United States Patent

Iino et al.

[11] Patent Number: 6,140,828
[45] Date of Patent: Oct. 31, 2000

[54] PROBER AND PROBE METHOD

[75] Inventors: Shinji Iino; Haruhiko Yoshioka, both of Yamanashi-ken, Japan

[73] Assignee: Tokyo Electron Limited, Tokyo, Japan

[21] Appl. No.: 09/071,828

[22] Filed: May 4, 1998

[30] Foreign Application Priority Data

May 8, 1997 [JP] Japan ..................................... 9-134365

[51] Int. Cl.[7] ........................... G01R 31/00; G01M 11/00
[52] U.S. Cl. ............................................. 324/758; 324/765
[58] Field of Search .................................... 324/754, 755, 324/765, 158.1, 758, 757, 756; 269/276, 286, 24, 50; 439/482; 33/1 M, 573, DIG. 1

[56] References Cited

U.S. PATENT DOCUMENTS

| | | | |
|---|---|---|---|
| 5,321,453 | 6/1994 | Mori et al. | 324/754 |
| 5,404,111 | 4/1995 | Mori et al. | 324/758 |
| 5,604,446 | 2/1997 | Sano | 324/754 |

FOREIGN PATENT DOCUMENTS

| | | |
|---|---|---|
| 6-124982 | 5/1994 | Japan . |
| 9-33877 | 2/1997 | Japan . |

*Primary Examiner*—Vinh P. Nguyen
*Attorney, Agent, or Firm*—Oblon, Spivak, McClelland, Maier & Neustadt, P.C.

[57] ABSTRACT

A prober includes a probe card, a main chuck, a shaft member fixed on and extending downwardly from the main chuck, an X table and Y table for retaining the shaft member by use of a guide to be freely movable in a vertical direction, and a contact body fixed on the shaft member. The undersurface of the contact body is made parallel to the mounting surface of the main chuck. The prober further includes an elevation body whose center coincides with an extension line downwardly extending from the test center of the probe card, and an elevation body elevating mechanism for vertically moving the elevation body and a ball provided on the upper portion of the elevation body is slidably set in contact with the undersurface of the contact body.

9 Claims, 8 Drawing Sheets

PROBER AND PROBE METHOD

BACKGROUND OF THE INVENTION

This invention relates to a prober and a probe method, and more particularly a prober capable of bringing a plurality of probes formed on a probe card into contact with the electrodes of a substrate with a constant and optimum pressure.

FIGS. 11, 12 show a prober for testing the electrical characteristic of a semiconductor integrate circuit (which is hereinafter referred to as an "IC chip") formed on a semiconductor wafer (which is hereinafter referred to as a "wafer") as an example of a conventional prober. The conventional prober includes a loader chamber 1 in which the wafer W is pre-aligned and a prober chamber 2 for testing the electrical characteristic of the wafer W carried therein from the loader chamber 1. As shown in FIG. 12, a fork 3 and a sub-chuck 4 are disposed in the loader chamber 1. The wafer W is pre-aligned by the sub-chuck 4 with the orientation flat thereof used as a reference while it is being carried by the fork 3. A main chuck 5 and an alignment mechanism 6 having upper and lower cameras are disposed in the prober chamber 2. The main chuck 5 having the wafer W mounted thereon can be moved in X, Y, Z and θ directions and is controlled by the alignment mechanism 6 so as to align the wafer W with probes (for example, probe needles) 7A of a probe card 7. After the alignment, the main chuck 5 rises, the probes 7A are set into electrical contact with the electrodes of the IC chip (S) formed on the wafer W mounted on the main chuck 5 and the electrical characteristic of the wafer W is tested via a test head T connected to the probes 7A. A temperature adjustment mechanism is disposed on the main chuck 5. The temperature of the wafer W can be set in a wide range of −50° C. to +160° C., for example, by the temperature adjustment mechanism. The wafer W can be subjected to the normal temperature test, low-temperature test, and high-temperature test.

At the time of test, the temperature of the main chuck 5 is set to a preset test temperature by the temperature adjustment mechanism. The wafer W mounted on the main chuck 5 is controlled by moving the main chuck 5 in the X, Y directions by use of the alignment mechanism 6 so as to align the probes 7A with the electrodes of the IC chip formed on the wafer W. The main chuck 5 thus aligned is raised to set the probes 7A into electrical contact with the electrodes of the IC chip (S) formed on the wafer W. A test portion and the electrodes of the IC chip (S) are connected together via the probes 7A and test head T and then the electrical characteristic of the IC chip (S) is tested. The probe card 7 is removably mounted on a head plate 8 which forms the top panel of the prober chamber 2.

As shown in FIG. 11, the main chuck 5 is mounted on X and Y tables 9 (the X table and Y table are shown as integrally formed in the drawing for convenience of the explanation) which are separately and reciprocally moved in the X direction and Y direction and is reciprocally moved in the X and Y directions according to the movement of the X and Y tables 9. As schematically shown in FIG. 13, an elevating mechanism 10 for moving the main chuck 5 in the Z direction is disposed on the X, Y tables 9. For example, the elevating mechanism 10 includes a motor 10B set in a hollow cylindrical container 10A, a ball screw 10C rotated by the motor 10B, and a nut member (not shown) engaged with the ball screw and the main chuck 5 is moved up and down by means of the nut member according to the rotation of the ball screw 10C in the direction indicated by the arrow Z in the drawing. As is well known in the art (FIG. 11), the traveling distance of the main chuck 5 in the vertical direction at the time of test is measured by use of the upper camera 6A, lower camera 6B and target 6C of the alignment mechanism 6, for example. The elevating mechanism 10 is driven according to the measurement data. The probes 7A, target 6C and wafer W are photographed by use of the upper camera 6A and lower camera 6B and the above traveling distance in the vertical direction is calculated based on position coordinate data of the main chuck 5 in the respective photographing positions.

In the days in which the wafer size ranges from 6 in. or 8 in. to 12 in., the wafer size is not only increased but also the integrated circuit is miniaturized and the pitch between electrode pads becomes increasingly smaller. For this reason, the conventional prober has problems to be solved. For example, when the IC chip S lying on the peripheral portion of the wafer W are tested, for example, a unbalanced load which is as large as several kilograms is applied to the main chuck 5. This phenomenon becomes more significant as the number of terminals such as the probes 7A increases when a plurality of chips are simultaneously tested, for example. As exaggeratingly indicated by the one-dot-dash line in FIG. 13, the X and Y tables 9 are bent by inclination of the main chuck 5 and the contact pressure (needle pressure) between a plurality of probes 7A and the electrodes of the IC chip (S) on the wafer W fluctuates. Therefore, the reliability of test may be lowered. If the wafer size becomes as large as 12 in., the distance from the center of the main chuck to an acting point becomes longer than the conventional case. Inclination of the main chuck 5 becomes significant and the fluctuation in the pressure of the contact with the plurality of probes 7A becomes significant. In some cases, some of the probes 7A may not be brought into contact with the electrodes of the IC chip (S) on the wafer W. There is a possibility that the reliability will be extremely lowered.

In the conventional prober, the distance between the wafer W on the main chuck 5 and the probes 7A is derived by use of the depths of focus of the cameras 6A, 6B of the alignment mechanism 6. The distance measurement by focusing of the cameras 6A, 6B has a limitation. Normally, there occurs a measurement error of 10 μm or more. In the case of a wafer of 12 in., the integration density of the IC chip is extremely enhanced and the film thickness of insulating layers and wiring layers is made increasingly smaller. For example, a membrane contactor or a contactor such as a conventional tungsten needle cannot compensate for the fluctuation in the height direction and the precision (the range of use) in the height direction is limited. In the above contactor, if a measurement error of 10 μm or more occurs in the distance measurement between the wafer W and the probes 7A, the contact pressure of the probes is largely influenced. Thus, it becomes difficult to control the needle pressure to an optimum value. In combination of the inclination of the main chuck 5, a partially excessively high pressure is applied to the probes in an extreme case, and the probes and the IC chip (S) may be damaged.

BRIEF SUMMARY OF THE INVENTION

This invention is made to solve the above problem. This invention provides a prober in which the reliability of test can be enhanced by horizontally holding the main chuck and setting a plurality of probes in contact with a substrate with a constant contact pressure even when the diameter of the substrate becomes large.

This invention provides a prober in which the reliability of test can be further enhanced by suppressing a measurement error of the distance between the substrate and the contact terminal to minimum so as to control the contact pressure between the probes and the substrate to an optimum value.

According to the first aspect of this invention, there is provided a prober for testing the electrical characteristic of a substrate, which comprises a probe card having probes and held on the upper portion of a prober chamber; a main chuck disposed below the probe card, for mounting the substrate thereon; a retainer mechanism for retaining the main chuck to be movable in the vertical direction and movable in one horizontal direction and in a horizontal direction perpendicular to the one horizontal direction; an alignment mechanism for aligning the probe card and the substrate mounted on the main chuck by controlling the horizontal movement of a table; a main chuck elevating mechanism for vertically moving the main chuck towards the probe card; and a control mechanism for measuring a distance between the substrate and the probes and controlling the main chuck elevating mechanism based on the result of measurement; wherein the retainer mechanism includes a first table reciprocally movable in the one horizontal direction; a second table reciprocally movable in the horizontal direction perpendicular to the one horizontal direction, for supporting the first table to be reciprocally movable in the one horizontal direction; at least one shaft member fixed on the lower portion of the main chuck; and a guide member disposed on the first table, for supporting the shaft member to be movable in the vertical direction; and the main chuck elevating mechanism includes an elevation actuated body disposed on the lower portion of the shaft member and having an action surface parallel to the mounting surface of the main chuck; an elevation body slidably set in contact with the action surface of the elevation actuated body; and an elevation body elevating mechanism for moving the elevation body in the vertical direction along an extension line downwardly extending from a preset position of the probe card.

According to the second aspect of this invention, in the above prober, in order to measure the distance between the surface of the substrate mounted on the main chuck and the probes, the control mechanism includes a length measuring mechanism which includes a length measuring target horizontally disposed on the main chuck; a first optical length measuring machine for measuring the distance between the target and the probes by use of the target; and a second optical length measuring machine for measuring the distance between the target and the surface of the substrate by use of the target.

According to the third aspect of this invention, in the above prober, the shaft member fixed on the lower portion of the main chuck includes a plurality of shaft members.

According to the fourth aspect of this invention, in the above prober, the main chuck elevating mechanism includes a floating mechanism for floating the elevation actuated body by use of the elevation body.

According to the fifth aspect of this invention, in the above prober, the floating mechanism includes an electromagnet disposed on the elevation body elevating mechanism; and a permanent magnet disposed in the elevation actuated body in position opposite to the electromagnet.

According to the sixth aspect of this invention, in the above prober, the floating mechanism includes an electromagnet disposed on the elevation body elevating mechanism; and a magnetic substance disposed in the elevation actuated body in position opposite to at least the electromagnet.

According to the seventh aspect of this invention, in the above prober, the floating mechanism includes an emission mechanism disposed on at least one of the elevation body elevating mechanism and the elevation actuated body, for emitting compressed gas.

According to the eighth aspect of this invention, in the above prober, the elevation body has a profiling mechanism which is inclined according to inclination of the undersurface of the elevation actuated body and disposed on the upper surface thereof.

According to the ninth aspect of this invention, in the above prober, the floating mechanism includes an electromagnetic mechanism for applying an attraction force for landing the elevation actuated body on the elevation body to the elevation actuated body when the emission mechanism stops emission of the compressed gas.

According to the tenth aspect of this invention, there is provided a prober for testing the electrical characteristic of a substrate, which comprises a probe card having probes and held on the upper portion of a prober chamber; a main chuck disposed below the probe card, for mounting the substrate; a retainer mechanism for retaining the main chuck to be movable in the vertical direction and movable in one horizontal direction and in a horizontal direction perpendicular to the one horizontal direction; an alignment mechanism for aligning the probe card and the substrate mounted on the main chuck by controlling the horizontal movement of a stage; a main chuck elevating mechanism for vertically moving the main chuck towards the probe card; and a control mechanism for measuring a distance between the substrate and the probes and controlling the main chuck elevating mechanism based on the result of measurement; wherein the control mechanism includes a length measuring mechanism in order to measure the distance between the surface of the substrate mounted on the main chuck and the probes, and the length measuring mechanism includes a length measuring target horizontally disposed on the main chuck; a first optical length measuring machine for measuring the distance between the target and the probe by use of the target; and a second optical length measuring machine for measuring the distance between the target and the surface of the substrate by use of the target.

According to the eleventh aspect of this invention, in the above prober, the second optical length measuring machine measures the distance between the target and the surface of the substrate with the irregularity distribution of the surface of the substrate taken into consideration, and the control mechanism controls the elevation distance of the main chuck elevating mechanism based on the result of measurement of the second optical length measuring machine.

According to the twelfth aspect of this invention, there is provided a probe method comprising the steps of horizontally moving a main chuck in one horizontal direction and in a horizontal direction perpendicular to the one horizontal direction with respect to a probe card having probes and held in the upper portion of a prober chamber to align a substrate mounted on the main chuck with the probes; raising the main chuck towards the probes; setting the electrodes of the substrate in contact with the probes by the raising step; and testing the electrical characteristic of the substrate by transferring a measurement signal with respect to the substrate via the probes; wherein the step of raising the main chuck towards the probes is effected by vertically moving an elevation body which is slidalby set in contact with that action surface of an elevation actuated body fixedly coupled with the lower portion of the main chuck which is parallel to the mounting surface of the main chuck along an extension line downwardly extending from a preset position of the probe card by use of an elevation body elevating mechanism.

According to the thirteenth aspect of this invention, there is provided a probe method comprising the steps of horizontally moving a main chuck in one horizontal direction and in a horizontal direction perpendicular to the one horizontal direction with respect to a probe card having probes and held in the upper portion of a prober chamber to align a substrate mounted on the main chuck with the probes; raising the main chuck towards the probes; setting the electrodes of the substrate in contact with the probes by the raising step; and testing the electrical characteristic of the substrate by transferring a measurement signal with respect to the substrate via the probes; wherein the step of raising the main chuck having the substrate mounted thereon includes the steps of measuring a distance between the probes and a length measuring target horizontally provided on the main chuck by use of a first optical length measuring machine; measuring a distance between the target and the surface of the substrate by use of a second optical length measuring machine; deriving a distance between the probes and the substrate based on the distances measured by the above two distance measuring steps; and raising the main chuck towards the substrate based on the distance between the probe and the substrate derived by the above distance deriving step.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

There will now be described embodiments of this invention with reference to FIGS. 1 to 10.

A prober and a probe method of this invention can be applied to a prober and a probe method for testing the electrical characteristic of a substrate by use of probes. In this case, for convenience of the explanation, a prober and a probe method for testing the electrical characteristic of an IC chip formed on a semiconductor wafer are concretely explained.

Figure 1:
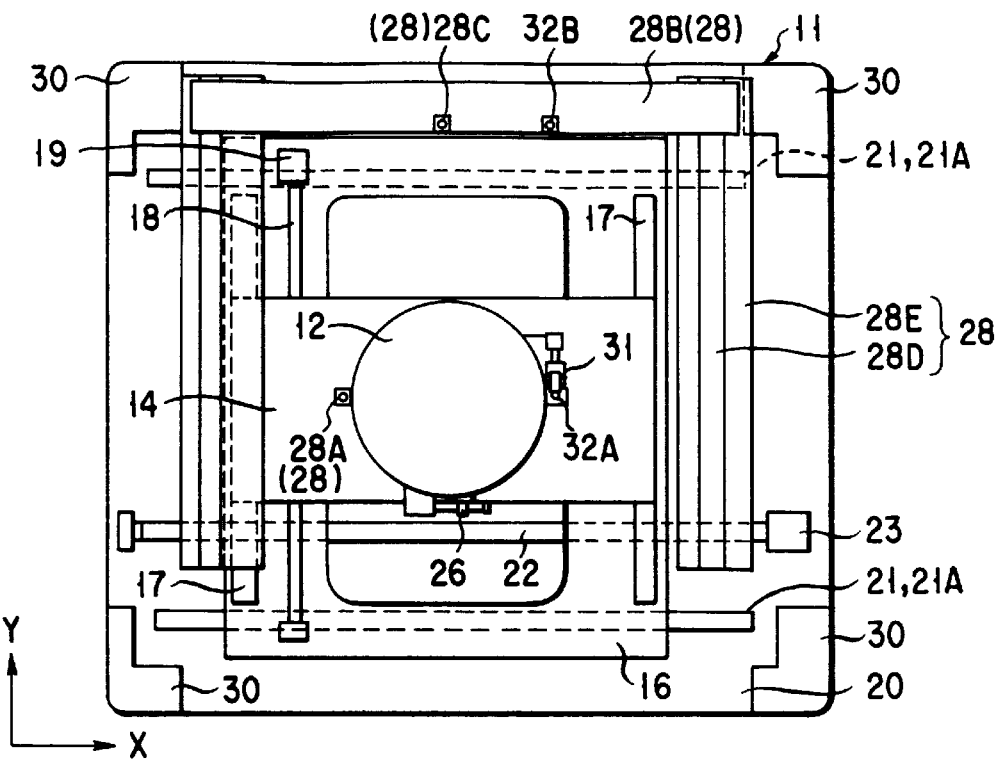
FIG. 1 is a plan view showing a probe chamber in one embodiment of a prober of this invention.
Figure 2:
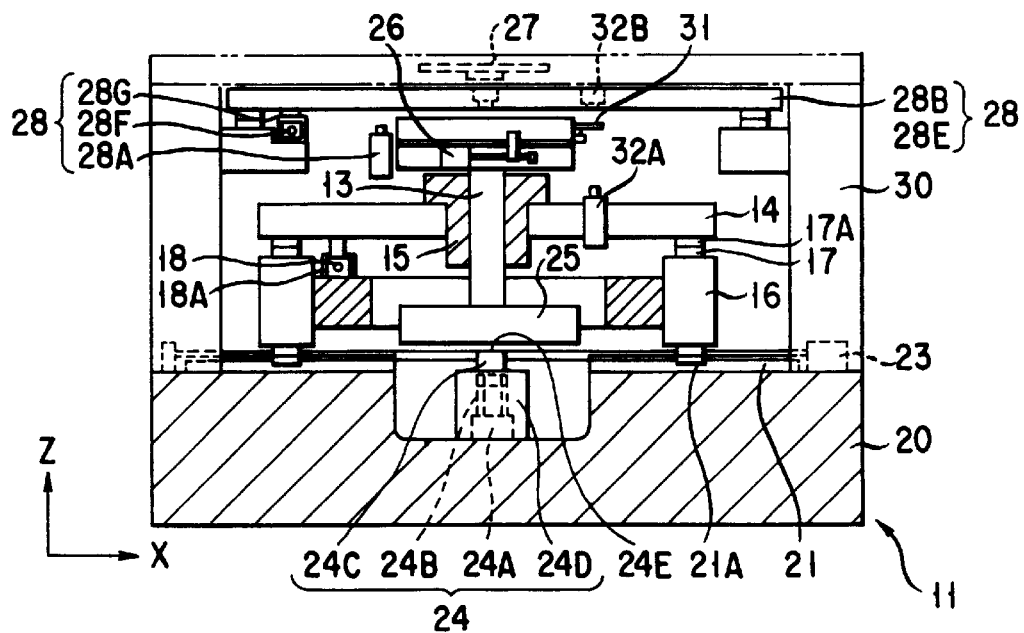
FIG. 2 is a cross sectional view showing the prober shown in FIG. 1.

As shown in FIGS. 1 and 2, a prober according to one embodiment of this invention has a feature in a prober chamber. As shown in FIGS. 1 and 2, a main chuck 12 for mounting a wafer W of 12 in., for example, is disposed in the prober chamber 11 in this embodiment. As shown in FIG. 2, the main chuck 12 has a shaft member 13 downwardly extending from the center of the undersurface of the main chuck. The shaft member 13 is supported on a Y table 14 via a guide member 15 so as to be moved in a vertical direction. That is, the guide member 15 is attached in the central hole of the Y table 14 or integrally formed with the Y table and the shaft member 13 penetrates the guide member 15 so as to be moved in the vertical direction. Together with the shaft member 13, the main chuck 12 is mounted to move in the vertical direction with respect to the Y table 14.

The Y table 14 is disposed to be reciprocally movable in a Y direction on the upper surface of an X table 16. That is, a pair of guide rails (which are hereinafter referred to as "Y guide rails") 17 which extend in the Y direction are formed on the right and left end portions of the upper surface of the X table 16. Engaging members 17A (refer to FIG. 2) mounted on the right and left end portions of the undersurface of the Y table 14 are engaged with the corresponding Y guide rails 17. A ball screw (which is hereinafter referred to as a "Y ball screw") 18 is disposed near the left Y guide rail 17 on the upper surface of the X table 16. The Y ball screw 18 is rotated in the forward and reverse directions by a motor 19. A nut member 18A attached to the undersurface of the Y stage 14 is engaged with the Y ball screw 18 and the Y table 14 is reciprocally moved in the Y direction on the X table according to the forward or reverse rotation of the Y ball screw 18.

The X table 16 is disposed to be reciprocally movable in the X direction on a base plate 20 of the prober chamber 11. A pair of guide rails (which are hereinafter referred to as "X guide rails") 21 which extend in the X direction are formed on the both end portions of the upper surface of the base plate 20 in the Y direction. Engaging members 21A mounted on both end portions of the X table 16 in the Y direction are engaged with the corresponding X guide rails 21. A ball screw (which is hereinafter referred to as an "X ball screw") 22 is disposed near the X guide rail 21 on the upper surface of the base plate 20 as shown in the lower portion of FIG. 1. The X ball screw 22 is rotated in the forward and reverse directions by a motor 23. A nut member (not shown) attached to the undersurface of the X table 16 is engaged with the X ball screw 22 and the X table 16 is reciprocally moved in the X direction on the base plate 20 according to the forward or reverse rotation of the X ball screw 22.

As shown in FIG. 2, a main chuck elevating mechanism 24 for vertically moving the main chuck 12 is disposed on substantially the central portion of the base plate 20 below the X table 16. The main chuck elevating mechanism 24 includes a motor 24A fixed on the bottom surface of the concave portion of the base plate 20, a ball screw 24B rotated in the forward and reverse directions by the motor 24A, an elevation body 24C formed of, for example, a rectangular nut member which is engaged with the ball screw 24B, and a guide member 24D along which the elevation body 24C is moved in the vertical direction. The motor 24A is driven according to a control value input to a driver 24F shown in FIG. 3. A ball 24E is rotatably buried in the central portion of the upper surface of the elevation body 24C (which lies on an extension line of the axis of the ball screw 24B). Part of the ball 24E projects from the upper surface of the elevation body and is slidably set in contact with the lower surface of an elevation actuated body (which is hereinafter referred to as a "contact body") 25 which is horizontally fixed on the lower end of the shaft member downwardly extending from the main chuck 12. The undersurface of the contact body 25 is a surface (contact surface) on which the elevation body 24C slides. The contact surface is made parallel to the mounting surface (upper surface) of the main chuck 12. If the elevation body 24C of the elevating mechanism 24 is maintained at a specified height, the mounting surface of the main chuck 12 can be moved in the same plane. The undersurface of the contact body 25 is made large enough to keep the ball 24E of the elevating mechanism 24 in contact with the undersurface of the contact body even if the main chuck 12 is moved to any position in the X and Y directions. Therefore, the main chuck 12 is moved in the X, Y, Z and θ directions with the contact body 25 kept in contact with the ball 24E of the elevating mechanism 24. Since the contact body 25 is always set in contact with the ball 24E of the elevating mechanism 24, the main chuck 12 is also vertically moved by means of the elevating mechanism 24 as the elevation body 24C is vertically moved. As shown in FIGS. 1, 2, the mounting surface of the main chuck 12 can be rotated in the forward and reverse directions in a θ direction by a θ rotation mechanism 26.

It is preferable to set the center of a probe card 27 to be tested on a line extending from the shaft center of the ball screw 24B. If the probes of the probe card 27 are brought into contact with the electrodes of the substrate and a load acts on the main chuck 12 via the probes, a reverse load always acts on the contact body 25 from the ball 24E directly below the probe card. Therefore, when a chip lying on the peripheral portion of the wafer W is tested, an unbalanced load acts on the main chuck 12 from the probe card, and if bending moment is applied with the shaft member 13 set as the fulcrum, an unbalanced load of the same magnitude and opposite direction is applied to the contact body 25 from the ball 24E of the elevating mechanism 24 and bending moment of the opposite direction is applied with the shaft member 13 set as the fulcrum. By the bending moment of the opposite direction, the bending moment from the probe card 27 is cancelled to prevent inclination of the main chuck 12. As a result, the unbalanced load from the main chuck 12 to the Y table 14 does not occur and the rigidity of the Y table 14, X table 16 and the like can be reduced. Even if highly precise X, Y table structures as in a linear motor are used, no load is applied to the X, Y tables and the position thereof at the time of application of the load can be precisely maintained.

An alignment mechanism 28 is arranged in the prober chamber 11. As shown in FIGS. 1, 2, the alignment mechanism 28 includes a lower camera 28A fixed on the peripheral surface of the main chuck 12, an alignment bridge 28B arranged along the X direction near the upper surface of the prober chamber 11 and reciprocally movable in the Y direction, an upper camera 28C fixed on the central portion of the alignment bridge 28B in the lengthwise direction thereof, and a target (not shown) of the cameras 28A, 28C. Like the conventional case, the lower camera 28A photographs the probe needle of the probe card 27 and the upper camera 28C photographs the wafer W on the main chuck 12. The coordinate positions obtained at this time are input to a controller 29 shown in FIG. 3 and the controller 29 calculates the positional relation between the wafer W and the probe needle based on the input values. The main chuck 12 is driven and controlled based on the positional relation and the wafer W and the probe needle are aligned. On the four corners of the base plate 20, columns 30 are erected. Supporting members 28E for supporting guide rails 28D with which the alignment bridge 28B is engaged are formed between these columns 30. A ball screw 28F which is parallel to the guide rail 28D is disposed on the left side supporting member 28E, and a nut member 28G on the undersurface of the alignment bridge 28B is engaged with the ball screw 28F. The alignment bridge 28B, that is, the upper camera 28C is reciprocally moved in the Y direction above the main chuck 12 via the ball screw 28F which is rotated in the forward and reverse directions by a motor (not shown).

Figure 3:
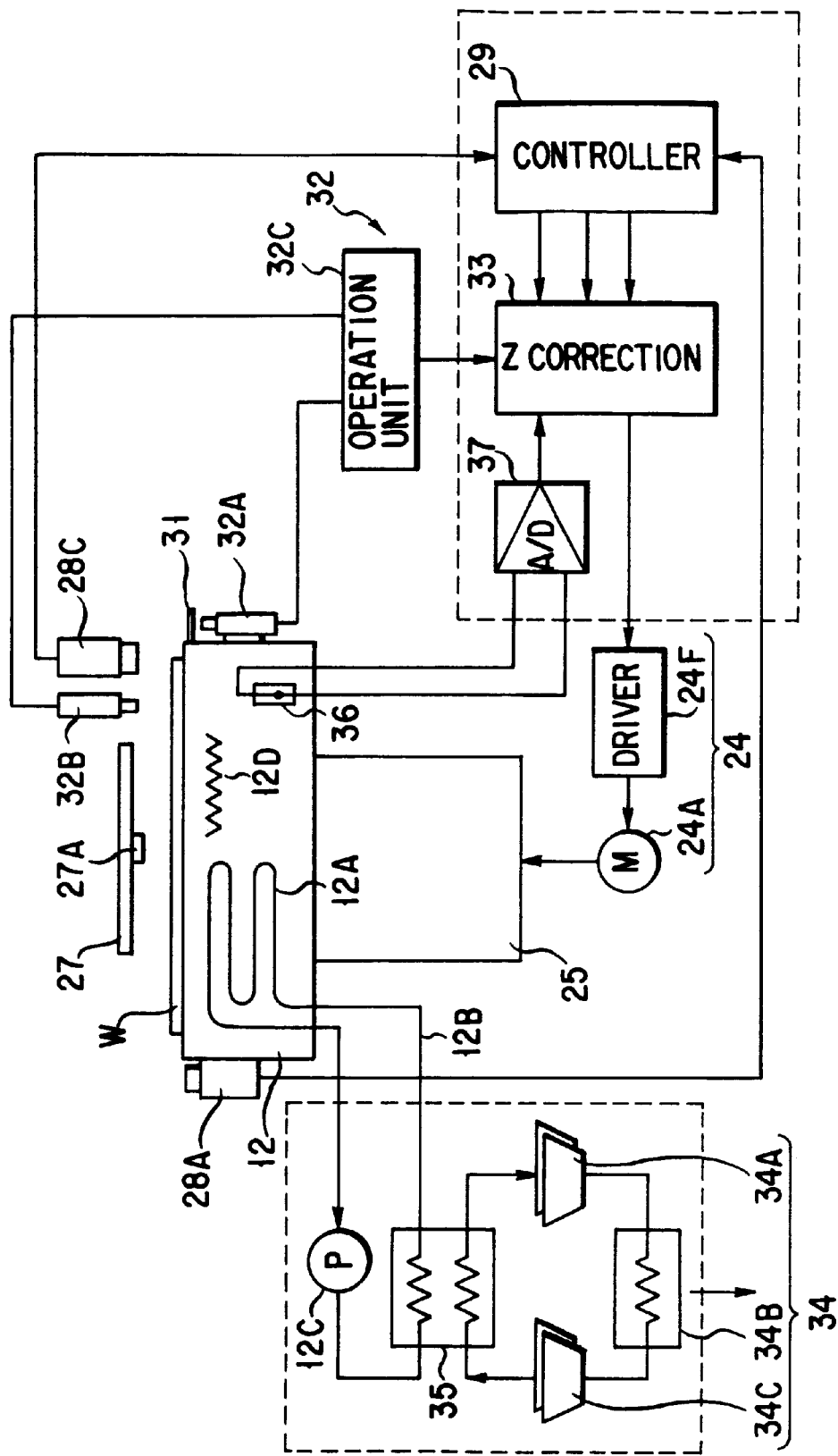
FIG. 3 is a construction diagram showing a control system of the prober shown in FIG. 1.

As shown in FIGS. 1 to 3, a length measuring target (which is hereinafter referred to simply as a "target") 31 is horizontally disposed on the main chuck 12. An optical length measuring machine (for example, laser length measuring machine) 32 for measuring the distance between the wafer W and the probes (for example, bump terminals) 27A by use of the target 31 is provided. As shown in FIG. 2, the target 31 is disposed to project from the peripheral surface of the main chuck 12 in the horizontal direction. Further, the target 31 may be so constructed as to project from the peripheral surface of the main chuck 12 at the time of measurement. The laser measuring machine 32 includes a lower laser measuring sensor 32A arranged on the Y table 14 with the face up in position adjacent to the main chuck 12, an upper laser measuring sensor 32B arranged on the alignment bridge 28B with the face down, and an operation unit 32C for calculating a distance between the wafer W and the probes 27A based on the measured values of the laser measuring sensors 32A, 32B. As the target 31, a target whose thickness is precisely known is used. The lower laser measuring sensor 32A may be disposed on the main chuck 12.

The irregularity distribution of the wafer surface and the distance between the wafer W and the probes 27A are measured by use of the laser measuring machine 32 as follows. The main chuck 12 is moved via the X, Y tables 16, 14 with the target 31 horizontally projected directly above the lower laser measuring sensor 32A, the alignment bridge 28B is moved to a preset position and the target 31 is positioned below the upper laser measuring sensor 32B. In this position, the distance between the sensor 32A and the target 31 is measured by the lower laser measuring sensor 32A. In parallel to or after the above operation, the distance between the upper measuring sensor 32B and the target 31 is measured in the same manner by the upper measuring sensor 32B. Then, the distance between the laser measuring sensors 32A and 32B is derived within an error of several microns based on the result of the above measurements and the thickness of the target 31.

The main chuck 12 is moved and the lower laser measuring sensor 32A is stopped in position directly below a specified position of the probe card 27. In this position, the distance between the lower measuring sensor 32A and the probe 27A is measured by the lower laser measuring sensor 32A. The main chuck 12 is moved and the wafer W is positioned directly below the upper laser measuring sensor 32B. In this position, the distance between the upper laser measuring sensor 32B and the wafer W is measured by the upper laser measuring sensor 32B. The operation unit 32C sequentially receives measurement data from both of the laser measuring sensors 32A, 32B and calculates the distance between the wafer W and the probe 27A based on the measurement data. By successively measuring the distance between each of the chips of the wafer W and the probe 27A, the operation unit 32C can form a map indicating the irregularity state of the surface of the wafer W.

The operation unit 32C is connected to a correction unit 33. The distance between the wafer W and the probes 27A and the irregularity data of the surface of the wafer W derived by the laser measuring machine 32 are input to the correction unit 33. The correction unit 33 has a program for correcting the distance between the wafer W and probes 27A according to the irregularity data. Based on the corrected value, the elevating mechanism 24 is driven to control the contact pressure between the wafer W and the probes 27A to an optimum value.

Further, the main chuck 12 can have a temperature adjusting mechanism. As shown in FIG. 3, a path 12A for coolant is formed in the main chuck 12, a coolant pipe 12B is connected to the opening of the coolant path 12A and the main chuck 12 is cooled to a preset low temperature by circulating the coolant between the path 12A and the coolant pipe 12B by use of a pump 12C. The coolant is cooled by a cooler 34 and heat exchanger 35. As shown in FIG. 3, the cooler 34 includes a compressor 34A, condenser 34B and expander 34C which construct a refrigerating cycle. For example, a plane heater 12D is contained in the main chuck 12. The main chuck 12 is heated to a preset temperature by the plane heater 12D.

A temperature sensor 36 is disposed in the main chuck 12. The temperature of the main chuck 12 is detected by the temperature sensor 36. The temperature sensor 36 is connected to the correction unit 33 via an A/D converter 37. Temperature data measured by the temperature sensor 36 is input to the correction unit 33. The correction unit 33 has a program for predicting and correcting a variation in the size of the main chuck based on the temperature data by taking the physical data of the material thereof into consideration. Based on the corrected value, the elevating mechanism 24 is driven to control the contact pressure between the wafer W and the probes 27A to an optimum value. The probes 27A are formed on the silicon substrate which has the same thermal expansion coefficient as the wafer W. Therefore, the probes 27A follow the thermal expansion of the wafer W and a plurality of probes 27A are set in contact with the electrodes of the wafer W without causing positional deviation irrespective of the test temperature.

Next, the operation is explained. A wafer W which is pre-aligned in a loader chamber (not shown) is placed on the main chuck 12 in the prober chamber 11. The main chuck 12 is moved in the X, Y directions via the X, Y tables 14, 16 by use of the alignment mechanism 28 and rotated in the forward and reverse directions in the θ direction by the θ driving mechanism 26 so that the substrate (wafer W) on the main chuck 12 and the probes 27A of the probe card 27 will be aligned. The laser measuring machine 32 is driven and the distance between the probes 27A of the probe card 27 and the wafer W is measured within an error of several microns.

The main chuck 12 is moved via the X, Y table 14, 16, the alignment bridge 28B is moved to a preset position, and the target 31 is positioned directly below the upper laser measuring sensor 32B. In this position, laser light is applied from the lower laser measuring sensor 32A to the target 31 to measure the distance between the lower laser measuring sensor 32A and the target 31. In parallel to or after the above operation, the distance between the upper measuring sensor 32B and the target 31 is measured in the same manner by the upper measuring sensor 32B. Then, the distance between the laser measuring sensors 32A and 32B is precisely derived within an error of several microns based on the result of the above measurements and the thickness of the target 31. The main chuck 12 is moved and the lower laser measuring sensor 32A is stopped in position directly below a specified one of the probes 27A of the probe card 27. In this position, the distance between the lower measuring sensor 32A and the probe 27A is measured by the lower laser measuring sensor 32A. The main chuck 12 is moved and the wafer W is positioned directly below the upper laser measuring sensor 32B. In this position, the distance between the upper laser measuring sensor 32B and the wafer W is measured by the upper laser measuring sensor 32B.

The temperature sensor 36 measures the temperature of the main chuck 12. The operation unit 32C calculates the distance between the wafer W and the probes 27A based on the measured data from the laser measuring sensors 32A, 32B. By successively measuring the distance between each of the chips of the wafer W and the probes 27A, the operation unit 32C can form a map indicating the irregularity state of the surface of the wafer W. The correction unit 33 corrects the distance between the surface of the wafer W and the probes 27A based on the irregularity data and corrects the size of the main chuck 12 for the present temperature based on the measurement of the temperature sensor 36. At the time of test of the wafer W, the corrected value of the correction unit 33 is fetched into the driver 24F of the elevating mechanism 24. The driver 24F controls the motor 24A according to the corrected value. The main chuck 12 is vertically moved to the contact position between the wafer W and the probes 27A, the wafer W is brought into contact with the probes 27A with an optimum contact pressure and a preset test is made.

When the wafer W is tested, the main chuck 12 is moved in the X, Y directions by use of the X, Y tables 14, 16 and the test position is set directly below the probes 27A. The elevating mechanism 24 is driven and the main chuck 12 is raised, the electrodes of the IC chip and the probes 27A are brought into contact with each other, and a preset test is made. After the test, the main chuck 12 is lowered and then moved in the X, Y directions by use of the X, Y tables 14, 16. Each of the chips of the wafer W which is raised via the elevating mechanism 24 is sequentially tested.

When the chip of the peripheral portion of the wafer W is tested, an unbalanced load is applied from the probes 27A to the main chuck 12. However, in the prober of this embodiment, since the contact body 25 which is fixed on the main chuck 12 directly below the test center of the probe card 27 is supported, the unbalanced load acting on the main chuck 12 is cancelled by an unbalanced load acting on the contact body 25 from the elevation body 24C. The main chuck 12 is prevented from being inclined and can always be held in the horizontal position during the test. A plurality of probes 27A is brought into contact with the wafer W with a constant contact pressure and a test which is always stable and highly reliable can be made. As described above, since the contact pressure of the probes 27A is controlled to an optimum value, an abnormal contact pressure will not be applied to the wafer W, thereby making it possible to prevent the wafer W from being damaged.

As described above, according to the above embodiment, the main chuck elevating mechanism 24 having the elevation body 24C whose shaft center coincides with an extension line extending downwardly from the test center of the probe card 27 is provided. The elevation actuated body (contact body) 25 is coupled to the shaft member 13 which is fixed to extend downwardly from the center of the undersurface of the main chuck 12 so that it can always be set in contact with the elevation body 24C of the main chuck elevating mechanism 24. The undersurface of the contact body 25 is made parallel to the mounting surface of the main chuck 12. The mounting surface of the main chuck 12 is kept in the horizontal position at the time of test even for a 12-inch wafer, a plurality of probes 27A and the wafer W are stably set in contact with each other with a contact pressure kept always constant, and thus the reliability of the test is enhanced. Since the main chuck 12 can always be held in the horizontal position, the rigidity of the X, Y tables 14, 16 can be reduced and made light, the height of the X, Y tables 14, 16 can be reduced and the height of the prober itself can be reduced.

According to this embodiment, the length measuring target 31 is provided in the horizontal position on the main chuck 12. By measuring the distance between the wafer W and the probes 27A by the laser measuring machine 32 by use of the target 31, the distance between the wafer W and the probes 27A is measured within an error of approximately several microns. The contact pressure of the probes 27A is controlled to an optimum value and the wafer W can be prevented from being damaged.

The laser measuring machine 32 is connected to the correction unit 33. The irregularity data of the wafer W measured by the laser measuring machine 32 is input to the correction unit 33 and the distance between the wafer W and the probes 27A is corrected according to the irregularity data by the correction unit 33. When an IC chip positioned in any position of the wafer W is tested, the contact pressure of the probes 27A can be controlled to an optimum value and the wafer W is prevented from being damaged.

Figure 4:
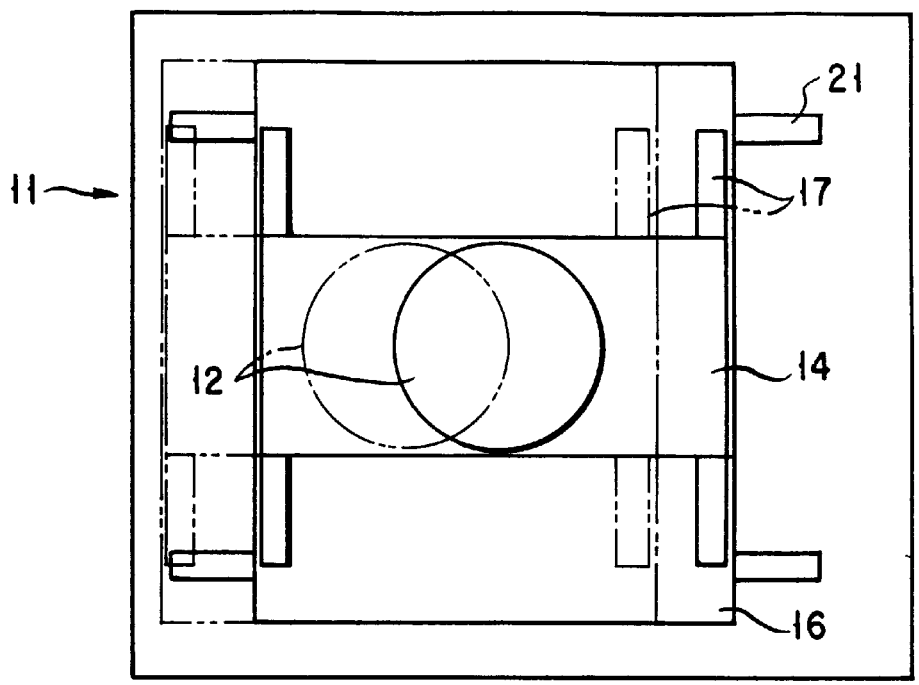
FIG. 4 is a plan view showing a probe chamber in another embodiment of a prober of this invention.
Figure 5:
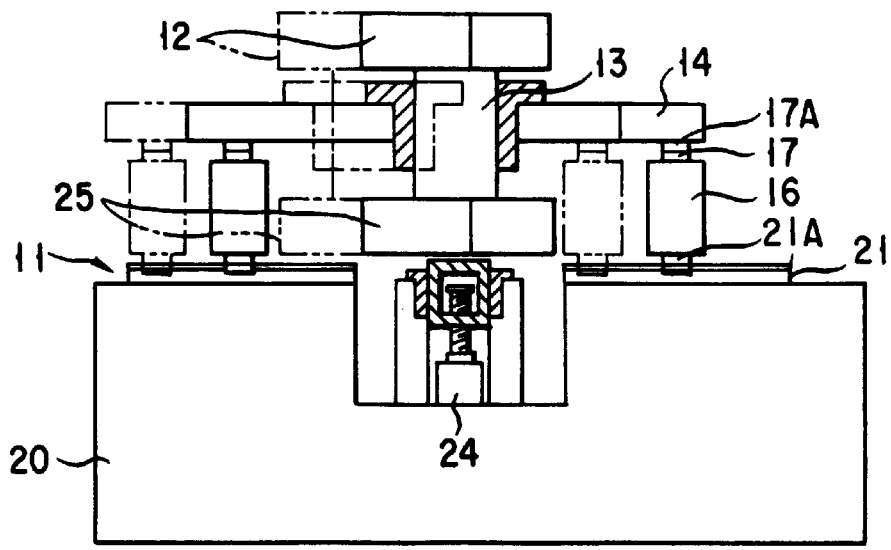
FIG. 5 is a cross sectional view showing the prober shown in FIG. 4.

The prober of this embodiment may be constructed as shown in FIGS. 4, 5. The prober is constructed with the same construction as the above embodiment except the structures of the guide rails of the X, Y tables. Portions which are the same as those of the above embodiment are denoted by the same reference numerals and the characteristic portion of the present embodiment is explained. In the present embodiment, guide rails 17, 21 of the X, Y tables 14, 16 are constructed by stators of linear motors. Engaging portions 17A, 21A are formed as armatures. The X, Y tables 14, 16 are floated from the stators and reciprocally moved in the X, Y directions. In the conventional structure, since the main chuck is inclined, the linear motor cannot be used as a driving mechanism for the X, Y tables. In the present embodiment, as shown in FIGS. 4 and 5, since the main chuck 12 is not inclined during the test, the linear motor can be used as the driving mechanism for the X, Y tables 14, 16 and the X, Y tables 14, 16 can be smoothly driven. The prober in the present embodiment also has an alignment mechanism 28 and laser measuring machine 32, but in FIGS. 4 and 5, they are omitted.

Figure 6:
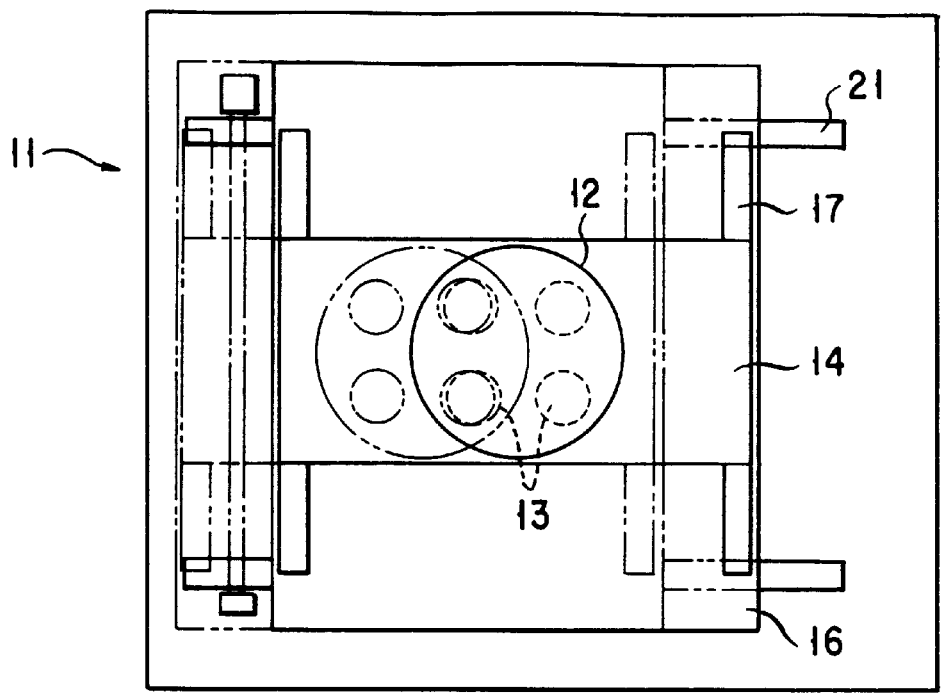
FIG. 6 is a plan view showing a probe chamber in still another embodiment of a prober of this invention.
Figure 7:
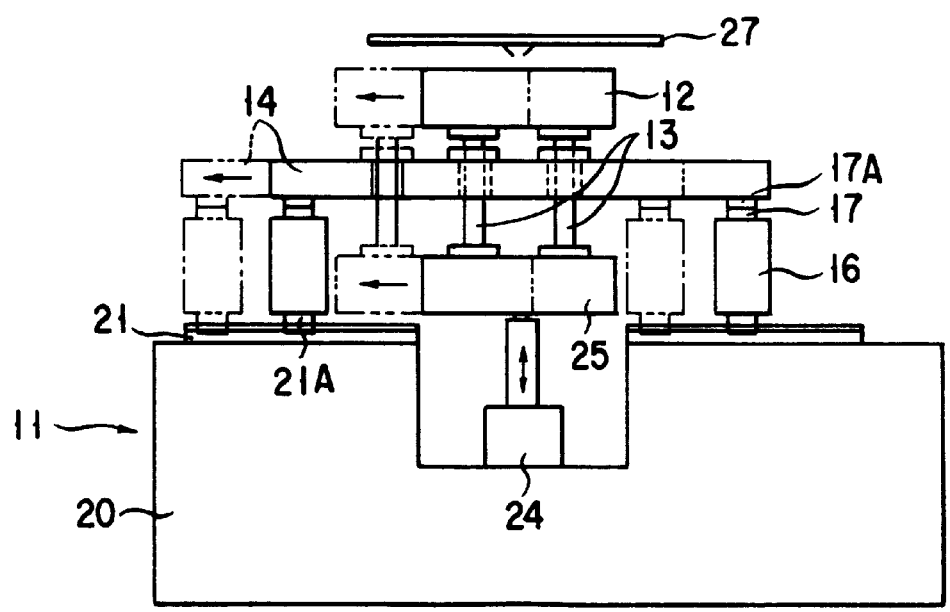
FIG. 7 is a cross sectional view showing the prober shown in FIG. 6.

The prober of this invention may be constructed as shown in FIGS. 6 and 7. The prober is constructed with the same structure as that of the prober of FIG. 4 except the structure of the main chuck 12. In the present embodiment, the main chuck 12 and the contact body 25 are coupled via four shaft members 13. The undersurface of the contact body 25 is set in contact with the ball 24E of the elevating mechanism 24. The four shaft members 13 are disposed at the same distance from the center of the main chuck 12. According to the present embodiment, bending moment does not substantially act on the X, Y tables 14, 16 at the time of test.

Figure 8:
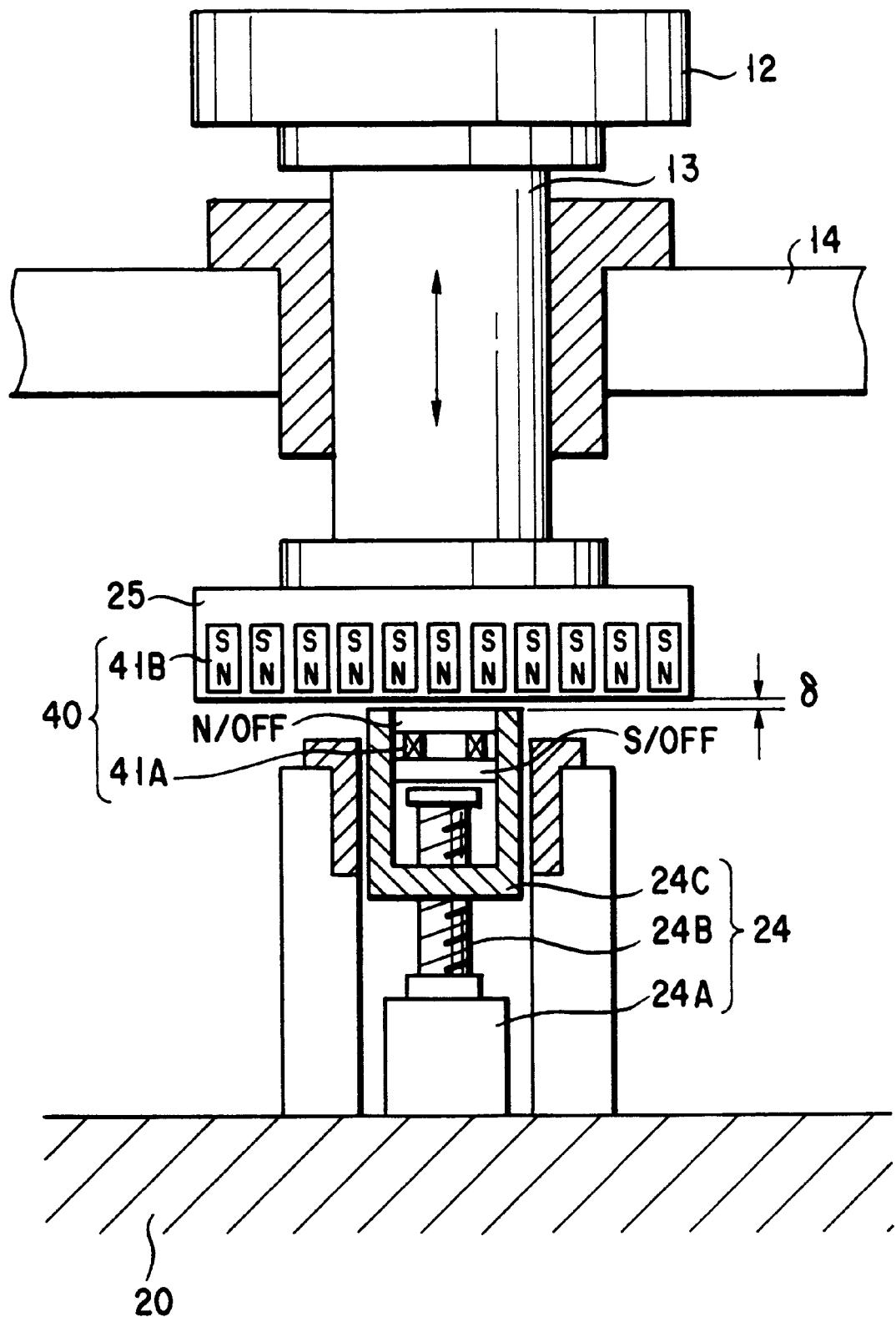
FIG. 8 is a cross sectional view showing an embodiment of a prober having floating means for the main chuck of this invention.

FIG. 8 is a view showing still another embodiment of the prober of this invention. The prober includes a floating device 40 for floating the main chuck 12 from the elevation body 24C. The main chuck 12 is fed by indexing with the contact body 25 kept in non-contact with the elevation body 24C by the floating device 40. As shown in FIG. 8, the floating device 40 includes an electromagnet 41A disposed on the elevation body 24C and permanent magnets 41B or magnetic substances disposed on the contact body 25 to face the electromagnet 41A. If the electromagnet 41A is excited by use of an excitation device (not shown), the upper portion of the elevation body 24C becomes an N pole and the lower portion of the elevation body 24C become an S pole. The permanent magnet 41B is formed with the undersurface portion of the contact body 25 formed as an N pole and the internal portion of the contact body 25 formed as an S pole. Therefore, if the electromagnet 41A is excited by the excitation device, the upper surface of the elevation body 24C becomes the N pole which is the same pole as the undersurface portion of the contact body 25 and they repel each other so that the main chuck 12 will be floated by $\delta$ (for example, 10 to 20 $\mu$m) from the elevation body 24C as shown in FIG. 8. When the electromagnet 41A is de-energized, repelling force between the elevation body 24C and the contact body 25 will disappear and the main chuck 12 lands on the elevation body 24C via the contact body 25. Therefore, when the wafer is fed by indexing, the electromagnet 41A of the elevation body 24C is excited to float the main chuck 12 from the elevation body 24C. Then, after the wafer is fed by indexing, the electromagnet 41A is de-energized and the main chuck 12 lands on the elevation body 24C. The main chuck 12 can be instantly fixed in the index-feeding position. Therefore, in the case of this embodiment, since the elevation body 24C and the contact body 25 are set in the non-contact state when the wafer is fed by indexing, it is ensured that the movement of the contact body with respect to the elevation body 24C in the X, Y directions can be smoothly made without causing any resistance due to friction between the elevation body and the contact body, the positioning can be made with high precision and generation of particles can be prevented.

Figure 9:
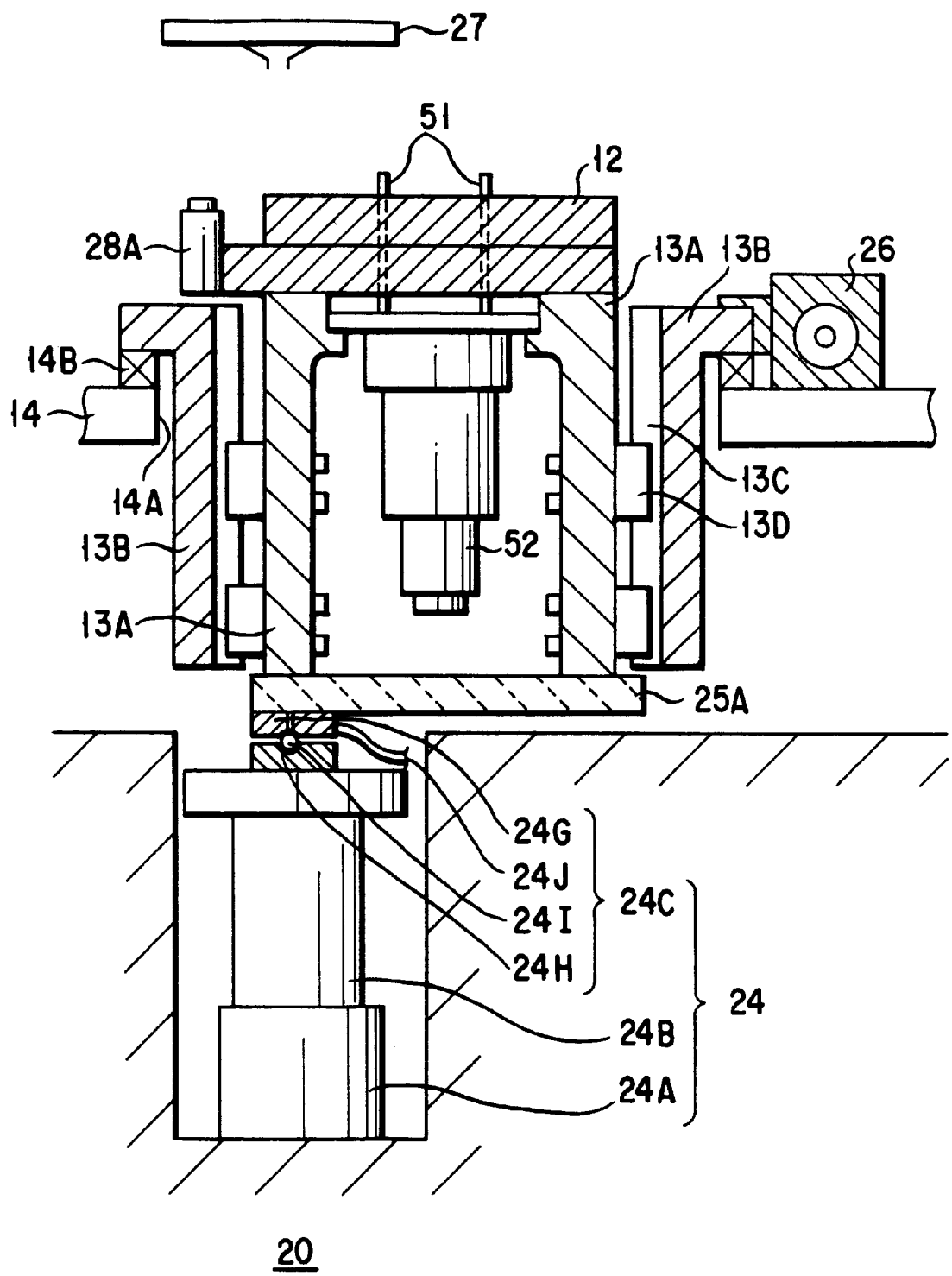
FIG. 9 is a cross sectional view showing an embodiment of a prober having floating means for another main chuck of this invention.

FIGS. 9 and 10 are views showing still another embodiment of the prober of this invention. In the present embodiment, a hollow cylinder 13A is used instead of the shaft member 13. The main chuck 12 is mounted on the upper end of the cylinder 13A. A contact body 25A is mounted on the lower end of the cylinder 13A. In the cylinder 13A, three pins 51 used for receiving or discharging a wafer are provided so as to be vertically moveable by a pin elevating mechanism 52. Outside the cylinder 13A, a supporting hollow cylinder 13B for supporting the cylinder 13A therein to be freely movable in the vertical direction is provided. The supporting cylinder 13B is coaxially provided with the cylinder 13A. The supporting cylinder 13B is mounted in a hole 14A formed in the Y table 14 with play. A bearing 14B is provided between the Y table 14 and a flange on the upper end. A θ rotation mechanism 26 is coupled with the flange and rotate the supporting cylinder 13B in the forward and reverse directions in the θ direction via the bearing 14B. On the inner surface of the supporting cylinder 13B, guide members 13C such as LM guides are disposed to extend along the axial direction and disposed at regular intervals in the peripheral direction. On the outer peripheral surface of the cylinder 13A, guide blocks 13D which engage with the respective guide members 13C are mounted. The cylinder 13A is vertically moved inside the supporting cylinder 13B via the guide members 13C and guide blocks 13D. The cylinders 13A, 13B are formed of an aluminum molding, for example, and the contact body 25A is formed of ceramics or ceramics subjected to polish-finishing after the hard chromium plating process, for example.

The elevation body 24C in this embodiment uses an air bearing 24G as the floating device disposed on the contact side with the contact body 25A. Below the air bearing 24G, a base body 24H is disposed and, for example, a steel-made ball 24I is provided in concave portions formed in the central portions of the opposite surfaces of the air bearing 24G and the base body 24H to construct a profiling mechanism, and the main chuck 12 is instantly (for example, within approx. 0.5 sec) floated from the air bearing by compressed air emitted from the air bearing 24G. The air bearing 24G is freely inclined according to the inclination of the contact body 25A via the ball 24I. The air bearing 24G has internal paths which are dispersed at the upper surface and opened and compressed air supplied to the internal paths from an air pipe 24J is emitted from the openings of the upper surface.

Therefore, when the wafer is fed by indexing, the main chuck 12 is instantly floated by, for example, 10 to 20 μm by the air bearing 24G. In this state, the main chuck 12 can be fed by indexing in the non-contact state. It is ensured that the movement of the contact body 25A with respect to the elevation body 24C in the X, Y directions can be smoothly made without causing any resistance due to friction between the elevation body 24C and the contact body 25A, the positioning can be made with high precision and generation of particles can be prevented. At the time of index feeding of the wafer, since the air bearing 24G is inclined via the ball 24I according to the inclination of the contact body 25A even if the contact body 25A is slightly inclined, the main chuck 12 can be smoothly moved with the floating state kept. The inadvertent contact between the elevation body 24C and the contact body 25A can be prevented and it is ensured that the movement of the contact body with respect to the elevation body 24C in the X, Y directions can be smoothly made without causing any resistance due to the contact between the elevation body and the contact body, the positioning can be made with high precision and generation of particles can be previously prevented.

Figure 10A:
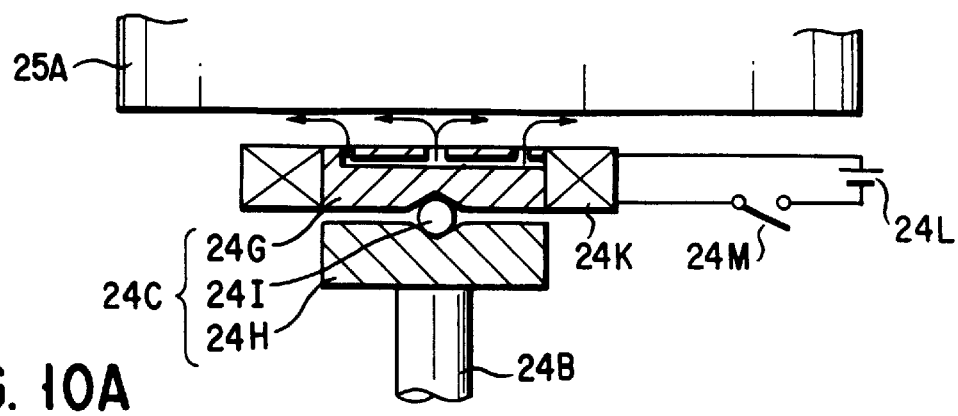
FIG. 10A is a cross sectional view showing another embodiment of the floating means and attraction means for the main chuck of this invention.
Figure 10B:
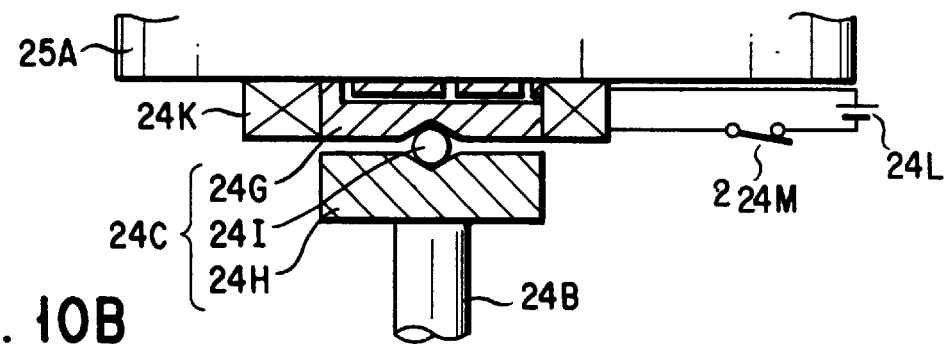
FIG. 10B is a view showing the state in which the main chuck is landed on the elevation body by the attraction means.
Figure 13:
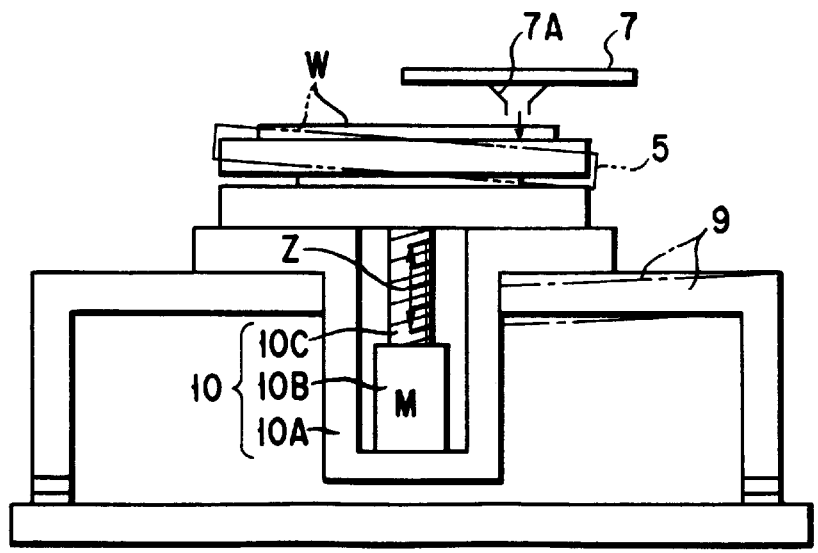
FIG. 13 is a cross sectional view schematically showing the main chuck of the prober shown in FIG. 11.
Figure 11:
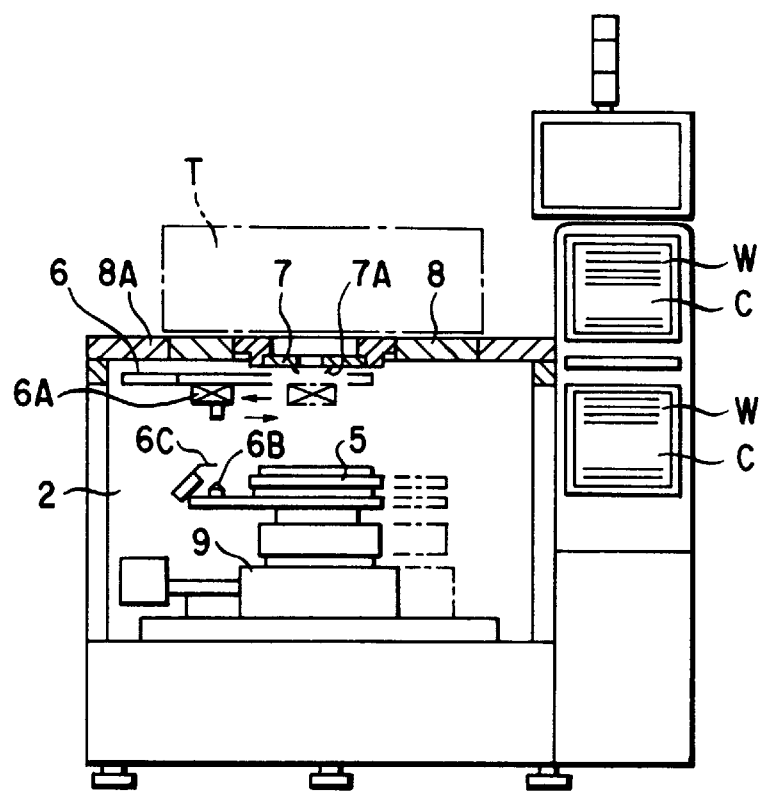
FIG. 11 is a view showing a conventional prober.
Figure 12:
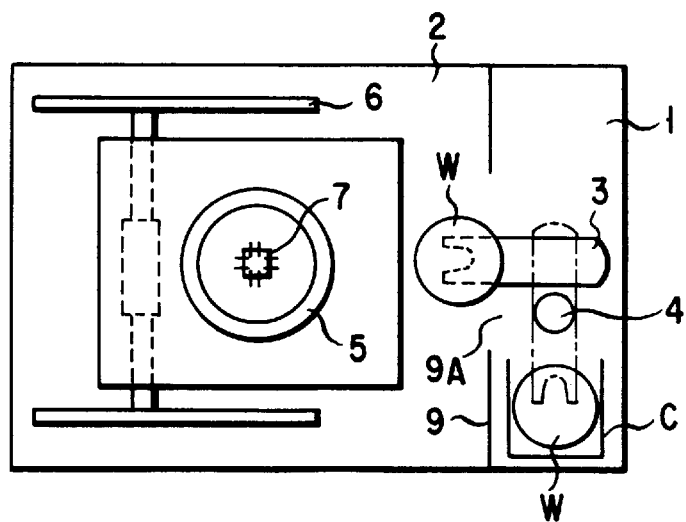
FIG. 12 is a plan view showing the prober shown in FIG. 11.

FIGS. 10A, 10B are cross sectional views showing the main portions of still another embodiment of this invention. In the case of this embodiment, an electromagnet 24K is added to the elevation body 24C shown in FIG. 9. The present embodiment is constructed in the same manner as the prober shown in FIG. 9 except that the contact body 25A is formed of a magnetic substance and attracted by the electromagnet 24K. The electromagnet 24K is connected to a power supply 24L and switch 24M. By turning ON the switch 24M, the electromagnet 24K is excited and the contact body 25A is attracted. When the wafer is fed by indexing, the main chuck 12 is instantly floated via the air bearing 24G with the switch 24M set in the OFF state as shown in FIG. 10A, and after the index-feeding of the wafer, the switch 24M is turned ON as shown in FIG. 10B, the electromagnet 24K is excited to attract the contact body 25A and the main chuck 12 instantly (for example, within approx. 0.5 sec) lands and is fixed on the elevation body 24C in the index-feeding position. In the case of this embodiment, after index feeding, the main chuck 12 can more rapidly land on the elevation body 24C by use of the electromagnet 24K and the throughput can be enhanced.

According to the first aspect of this invention, even if the diameter of the substrate is enlarged in the future, the main chuck can always be held in the horizontal position at the time of test and a plurality of probes (probe needles) and the substrate can be set in contact with each other with a constant contact pressure, thereby making it possible to provide a prober whose reliability for test can be enhanced.

According to the second aspect of this invention, even if the diameter of the substrate is enlarged in the future, the main chuck can be held in the horizontal position at the time of test and a plurality of probes (probe needles) and the substrate can be set in contact with each other with a constant contact pressure. A measurement error of the distance between the substrate and the probes can be suppressed as small as possible, the needle pressure is set to an optimum value, and the reliability for test can be further enhanced.

Further, according to the third aspect of this invention, there is provided a prober in which substantially no bending moment occurs with respect to the X, Y tables even when an unbalanced load is applied to the main chuck.

According to the fourth, fifth, sixth and seventh aspects of this invention, there is provided a prober in which the main chuck can be fed by indexing in the non-contact state and generation of particles can be suppressed.

According to the eighth aspect of this invention, there is provided a prober in which inadvertent generation of particles can be prevented at the time of index feeding.

According to the ninth aspect of this invention, there is provided a prober in which the positioning of the main chuck after index feeding can be rapidly effected and the throughput can be enhanced.

According to the tenth aspect of this invention, there is provided a prober in which a measurement error of the distance between the substrate and the probes can be suppressed as small as possible, the pressure by the probes is set to an optimum value, and the reliability for test can be further enhanced.

According to the eleventh aspect of this invention, there is provided a prober in which the contact pressure between the substrate and the probes can be kept constant irrespective of the irregularity of the surface of the substrate.

According to the twelfth aspect of this invention, there is provided a probe method in which even if the diameter of the substrate is enlarged in the future, the main chuck can always be held in the horizontal position at the time of test, a plurality of probes (probe needles) and the substrate can be set in contact with each other with a constant contact pressure, and the reliability for test can be enhanced.

According to the thirteenth aspect of this invention, there is provided a probe method in which a measurement error of the distance between the substrate and the probes can be suppressed as small as possible, the pressure by the probes is set to an optimum value, and the reliability for test can be enhanced.

This invention is not limited to the above embodiments at all.

As the probes in this invention, any terminals which can be made electrically contact with the electrodes of the substrate can be used. For example, needle-like terminals, bump-form terminals can be used.

The first and second tables of this invention are not limited to stage-like structures. As the tables, any structures which can be reciprocally moved in preset horizontal directions and cooperated with each other to permit the main chuck to be reciprocally moved in all horizontal directions can be used.

The shaft member of this invention may be any type of member if it is supported on the main chuck supporting mechanism so as to be vertically moved, and may be a member which is supported to be vertically movable and rotatable. The shaft member may be formed of a structure such as a solid cylinder, hollow cylinder, rectangular column or rectangular hollow column. The surface of the shaft member can be made as a smooth surface or a surface having irregularity such as groves. The number of shaft members and the size and length thereof can be adequately determined by taking the size and weight of the main chuck and the contact pressure between the probes and the IC chip into consideration.

As the guide member in this invention, any type of guide member can be used if it supports the shaft member on the first table to be vertically movable. The guide member may be a structure mounted on the first table or integrally formed with the first table.

As the elevation actuated body in this invention, any type of structure can be used if it ensures that the elevation body can be made contact and slide in a preset range in which the main chuck is moved. The size, shape and material of the elevation actuated body can be adequately determined according to the structures of the main chuck, shaft member, and elevation body.

As the elevation body in this invention, the rectangular nut member is explained. However, the shape of the elevation body is not limitative and a structure of a solid cylinder, hollow cylinder, rectangular column or rectangular hollow column may be used. As the mechanism for smoothly sliding the undersurface of the elevation actuated body on the upper portion of the elevation body, the mechanism using the ball 24E, the mechanism using the electromagnetic force, and the mechanism using the air bearing are explained in the above explanation. In the above mechanisms, the configuration using the ball 24E, the configuration using the electromagnetic force, and the configuration using the air bearing can be adequately determined by those skilled in the art when they design and embody this invention. Further, in addition to the above mechanism, another mechanism which smoothly permits the above sliding movement can be used.

In "preset position of the prober card" contained in the description "the elevation body is vertically moved along an extension line downwardly extending from a preset position of the prober card", the test center of the prober card (the central position when the probes are set in contact with a semiconductor wafer mounted on the main chuck) is preferably set, but a position which is slightly separated from the test center can be used.

As the elevation body elevating mechanism in this invention, in addition to the mechanism using the ball screw described above, an elevating mechanism such as a mechanism applying the principle of a lever, a mechanism applying a hydraulic pressure or gas pressure or the like can be used.

The optical measuring machine in this invention is not limited to the laser measuring machine 32, and any type of measuring machine which uses light can be used.

In the above explanation, various embodiments are explained in a case where this invention is applied to the prober which tests the electrical characteristic of the IC chip formed on the semiconductor wafer. However, this invention is not limited to the above cases and can be applied to a case wherein the electrical characteristic of the substrate is tested by setting the probes in electrical contact with the test electrodes of the substrate.

In the explanation for FIG. 3, the controller 29 and the correction unit 33 are shown as different units, but they can be constructed as one unit.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. In a prober for testing electrical characteristics of a substrate, comprising:

a probe card having probes and held on an upper portion of a prober chamber;

a main chuck disposed below said probe card, for mounting the substrate on a mounting surface of it;

a retainer mechanism for retaining said main chuck to be movable in a first horizontal direction and in a second horizontal direction perpendicular to the first horizontal direction;

an alignment mechanism for aligning said probe card and the substrate mounted on said main chuck by controlling the horizontal movement of the retainer mechanism;

a main chuck elevating mechanism for vertically moving the main chuck towards said probe card; and a control mechanism for measuring a distance between the substrate and the probes and controlling said main chuck elevating mechanism based on the result of measurement, the improvement in which said retainer mechanism includes a first table reciprocally movable in the first horizontal direction; a second table reciprocally movable in the second horizontal direction perpendicular to the first horizontal direction, for retaining said first table to be reciprocally movable in the first horizontal direction; at least one shaft member fixed on the lower portion of said main chuck; and a guide member disposed on the first table, for retaining said shaft member to be movable in the vertical direction, and said main chuck elevating mechanism includes an elevation actuated body disposed on the lower portion of said shaft member and having an action surface parallel to the mounting surface of said main chuck; an elevation body slidably set in contact with the action surface of said elevation actuated body; and an elevation body elevating mechanism for moving said elevation body in the vertical direction along an extension line downwardly extending from a preset position of said probe card.

2. A prober according to claim 1, wherein said control mechanism includes a length measuring mechanism in order to measure a distance between a surface of the substrate mounted on said main chuck and the probes, and said length measuring mechanism includes a length measuring target horizontally disposed on said main chuck; a first optical length measuring machine for measuring a distance between the target and the probes by use of said target; and a second optical length measuring machine for measuring a distance between the target and the surface of the substrate by use of said target.

3. A prober according to claim 1, wherein said shaft member fixed on a lower portion of said main chuck includes a plurality of shaft members.

4. A prober according to claim 1, wherein said main chuck elevating mechanism includes a floating mechanism for floating said elevation actuated body by use of said elevation body.

5. A prober according to claim 4, wherein said floating mechanism includes an electromagnet disposed on said elevation body elevating mechanism; and a permanent magnet disposed in said elevation actuated body in position opposite to said electromagnet.

6. A prober according to claim 4, wherein said floating mechanism includes an electromagnet disposed on said elevation body elevating mechanism; and a magnetic substance disposed in said elevation actuated body in position opposite to at least said electromagnet.

7. A prober according to claim 4, wherein said floating mechanism includes an emission mechanism for emitting compressed gas disposed on at least one of said elevation body elevating mechanism and said elevation actuated body.

8. A prober according to claim 4, wherein said elevation body has a profiling mechanism which is inclined according to inclination of an undersurface of said elevation actuated body and disposed on an upper surface thereof.

9. A prober according to claim 7, wherein said floating mechanism includes an electromagnetic mechanism for applying an attraction force for landing said elevation actuated body on said elevation body to said elevation actuated body when said emission mechanism stops emission of a compressed gas.

* * * * *